US012621000B2

(12) United States Patent
Liu et al.

(10) Patent No.: US 12,621,000 B2
(45) Date of Patent: May 5, 2026

(54) SUCCESSIVE APPROXIMATION REGISTER ANALOG-TO-DIGITAL CONVERTER AND OPERATING METHOD THEREOF

(71) Applicant: PIXART IMAGING INC., Hsin-Chu County (TW)

(72) Inventors: Shiue-Shin Liu, Hsin-Chu County (TW); Hou-Tse Yu, Hsin-Chu County (TW)

(73) Assignee: PIXART IMAGING INC., Hsin-Chu County (TW)

( * ) Notice: Subject to any disclaimer, the term of this patent is extended or adjusted under 35 U.S.C. 154(b) by 112 days.

(21) Appl. No.: 18/663,083

(22) Filed: May 14, 2024

(65) Prior Publication Data

US 2025/0357943 A1 Nov. 20, 2025

(51) Int. Cl.
*H03M 1/44* (2006.01)
*H03M 1/38* (2006.01)
*H03M 1/46* (2006.01)

(52) U.S. Cl.
CPC ............. *H03M 1/442* (2013.01); *H03M 1/38* (2013.01); *H03M 1/462* (2013.01); *H03M 1/468* (2013.01)

(58) Field of Classification Search
CPC ........ H03M 1/442; H03M 1/468; H03M 1/38; H03M 1/462
USPC .................................................. 341/161, 172
See application file for complete search history.

(56) References Cited

U.S. PATENT DOCUMENTS

| | | | |
|---|---|---|---|
| 9,106,246 B2 * | 8/2015 | Yang ........................ | H03M 1/38 |
| 11,418,209 B2 * | 8/2022 | Wang ....................... | G05F 1/461 |
| 11,637,559 B2 * | 4/2023 | Lin ........................ | H03M 1/468 |
| | | | 341/172 |

* cited by examiner

*Primary Examiner* — Khai M Nguyen
(74) *Attorney, Agent, or Firm* — HAUPTMAN HAM, LLP

(57) ABSTRACT

The present disclosure provides an analog-to-digital converter including a comparator, a first capacitor array, a second capacitor array and a controller. The first capacitor array is controlled by a first control signal of the controller and coupled to a first input terminal of the comparator. The second capacitor array is controlled by a second control signal of the controller and coupled to a second input terminal of the comparator. The equivalent capacitance of a most significant bit (MSB) of the first and second capacitor arrays is two times of that of (MSB-1). The MSB includes multiple capacitors and the (MSB-1) includes at least one capacitor. The capacitance of each capacitor of the MSB is identical to that of each capacitor of the (MSB-1).

20 Claims, 9 Drawing Sheets

Figure 3B:
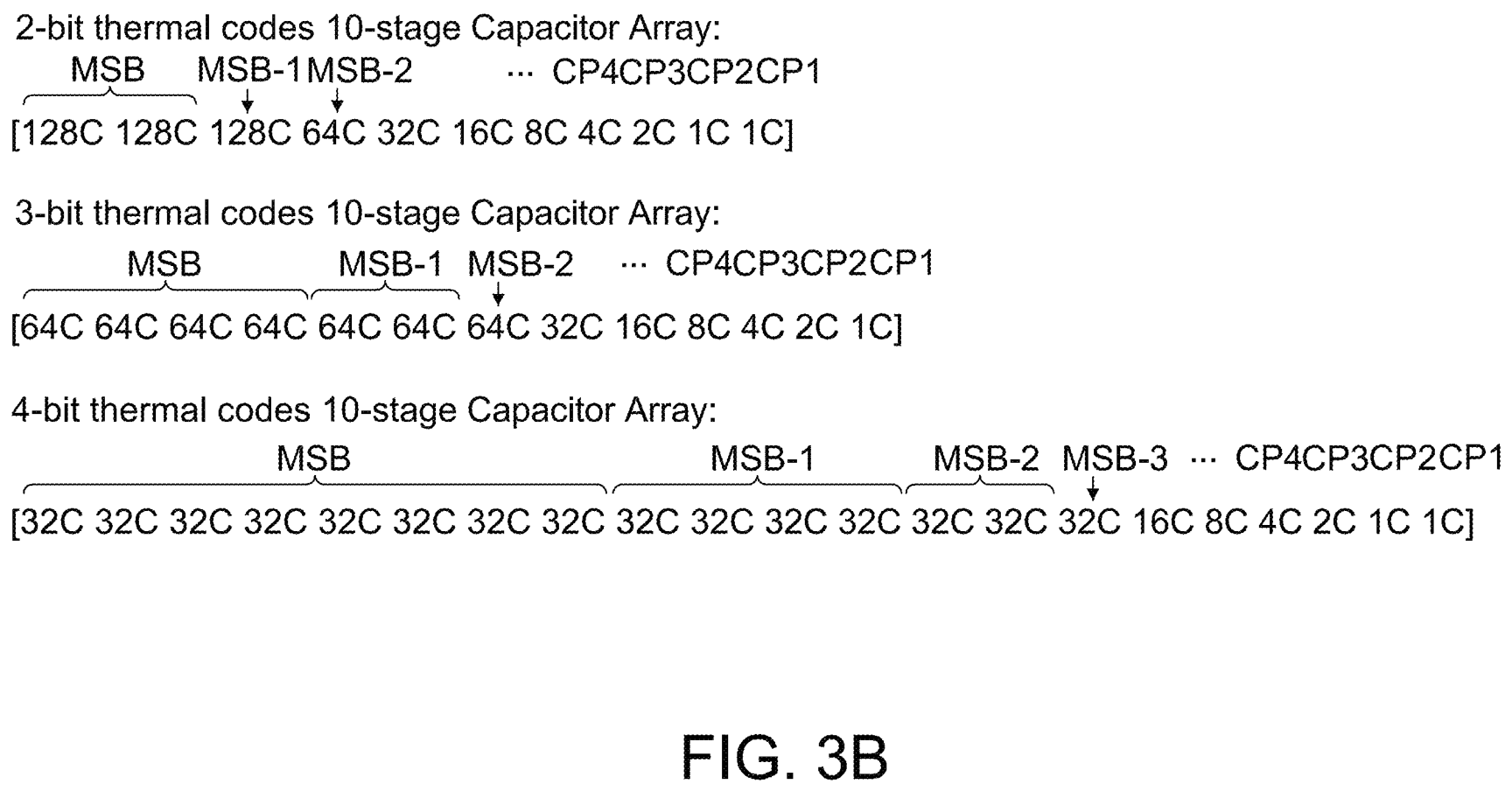

2-bit thermal codes 10-stage Capacitor Array:

MSB    MSB-1MSB-2    ... CP4CP3CP2CP1

[128C 128C 128C 64C 32C 16C 8C 4C 2C 1C 1C]

3-bit thermal codes 10-stage Capacitor Array:

MSB    MSB-1 MSB-2    ... CP4CP3CP2CP1

[64C 64C 64C 64C 64C 32C 16C 8C 4C 2C 1C]

4-bit thermal codes 10-stage Capacitor Array:

MSB    MSB-1    MSB-2 MSB-3 ... CP4CP3CP2CP1

SUCCESSIVE APPROXIMATION REGISTER ANALOG-TO-DIGITAL CONVERTER AND OPERATING METHOD THEREOF

BACKGROUND

1. Field of the Disclosure

The present disclosure generally relates to an analog-to-digital converter and, more particularly, to a successive approximation register analog-to-digital converter and an operating method thereof.

2. Description of the Related Art

It is known that the integral nonlinearity (INL) and differential nonlinearity (DNL) can be used as indexes of evaluating the performance of an analog-to-digital converter (ADC). The INL and DNL can reflect the capacitor mismatch of a capacitor array in the ADC. A successive approximation register (SAR) ADC mainly uses a switchable capacitor array to approach an analog input, but the error occurs in switching capacitors in the capacitor array.

It is known that the INL can be improved by using a fast binary window function in the SAR ADC. FIG. 1 is a schematic diagram of running the fast binary window function by an ADC converter, including switching zones and window zones. For example, FIG. 2 shows an operational schematic diagram of a differential ADC including three capacitors 4C, 2C and C, wherein it is assumed that analog inputs of the differential ADC are +0.3V and −0.3V. In the first conversion cycle, a code "1" is generated since Vp=+0.3>Vn=−0.3; in the second conversion cycle, the capacitor 4C is switched and a code "0" is generated since Vp=−0.2<Vn=+0.2; in the third conversion cycle, the capacitor 4C is switched back and the capacitor 2C is switched and a code "1" is generated since Vp=+0.05>Vn=−0.05; in the fourth conversion cycle, a code "1" is generated since Vp=+0.05>Vn=−0.05 and the capacitor 2C is not switched back; and in the fifth conversion cycle, the capacitor 1C is switched and a code "0" is generated since Vp=−0.075<Vn=+0.075, and the coding process is ended here, wherein Vp and Vn are input voltages of the differential ADC. The method of decoding the code "10110" is known to the art. However, the incorporation of the fast binary window function is not able to improve the DNL.

Therefore, an ADC that may improve both the INL and DNL is required.

The information disclosed in the Related Art herein is merely intended to increase understanding of the general background of the invention and should not be taken as an admission or in any way implied that the relevant information constitutes prior art that is already known to a person of ordinary skill in the art.

SUMMARY

Accordingly, the present disclosure provides an SAR ADC and an operating method thereof that improve both the INL and DNL by combining the fast binary window function and the thermal coding in the capacitor array.

The present disclosure provides an SAR ADC and an operating method thereof that improve the INL by reducing a number of switched capacitors in the capacitor array.

The present disclosure provides an SAR ADC and an operating method thereof that improve the DNL by replacing the most significant bit (MSB) capacitor with thermal coding capacitors.

The present disclosure provides an analog-to-digital converter including a comparator and a first capacitor array. The first capacitor array is coupled to a first input terminal of the comparator, and includes a first most significant bit (MSB) and a first (MSB-1), wherein the first MSB includes multiple capacitors, the first (MSB-1) includes at least one capacitor, and capacitance of each of the multiple capacitors of the first MSB is identical to that of each of the at least one capacitor of the first (MSB-1).

The present disclosure further provides an operating method of an analog-to-digital converter. The analog-to-digital converter includes a comparator, a first capacitor array and a second capacitor array respectively coupled to a non-inverting input terminal and an inverting input terminal of the comparator. The MSB of the first capacitor array and the second capacitor array respectively includes two capacitors and the (MSB-1) of the first capacitor array and the second capacitor array respectively includes one capacitor. The operating method includes the steps of: coupling the two capacitors of the MSB and the one capacitor of the (MSB-1) of the first and second capacitor arrays to a common voltage; grounding the two capacitors of the MSB of the first capacitor array upon a first analog input inputted into the non-inverting input terminal being larger than a second analog input inputted into the inverting input terminal; and coupling the two capacitors of the MSB of the first capacitor array to a reference voltage upon the first analog input being smaller than the second analog input, wherein the reference voltage is 2 times of the common voltage.

The present disclosure further provides an operating method of an analog-to-digital converter. The analog-to-digital converter includes a comparator, a first capacitor array and a second capacitor array respectively coupled to a non-inverting input terminal and an inverting input terminal of the comparator. The MSB of the first capacitor array and the second capacitor array respectively includes four capacitors, the (MSB-1) of the first capacitor array and the second capacitor array respectively includes two capacitors, and the (MSB-2) of the first capacitor array and the second capacitor array respectively includes one capacitor. The operating method includes the steps of: coupling the four capacitors of the MSB, the two capacitors of the (MSB-1) and the one capacitor of the (MSB-1) of the first and second capacitor arrays to a common voltage; grounding the four capacitors of the MSB of the first capacitor array upon a first analog input inputted into the non-inverting input terminal being larger than a second analog input inputted into the inverting input terminal; and coupling the four capacitors of the MSB of the first capacitor array to a reference voltage upon the first analog input being smaller than the second analog input, wherein the reference voltage is 2 times of the common voltage.

BRIEF DESCRIPTION OF THE DRAWINGS

Other objects, advantages, and novel features of the present disclosure will become more apparent from the following detailed description when taken in conjunction with the accompanying drawings.

FIG. 3B is a schematic diagram of different aspects of the capacitor array of an ADC according to one embodiment of the present disclosure.

DETAILED DESCRIPTION OF THE EMBODIMENT

It should be noted that, wherever possible, the same reference numbers will be used throughout the drawings to refer to the same or like parts.

One objective of the present disclosure is to provide a successive approximation register analog-to-digital converter (SAR ADC), abbreviated as ADC herein. The ADC combines thermal codes to a side close to the most significant bit (MSB) of an SAR ADC having the fast binary window function so as to improve both the IND and DNL.

Figure 1:
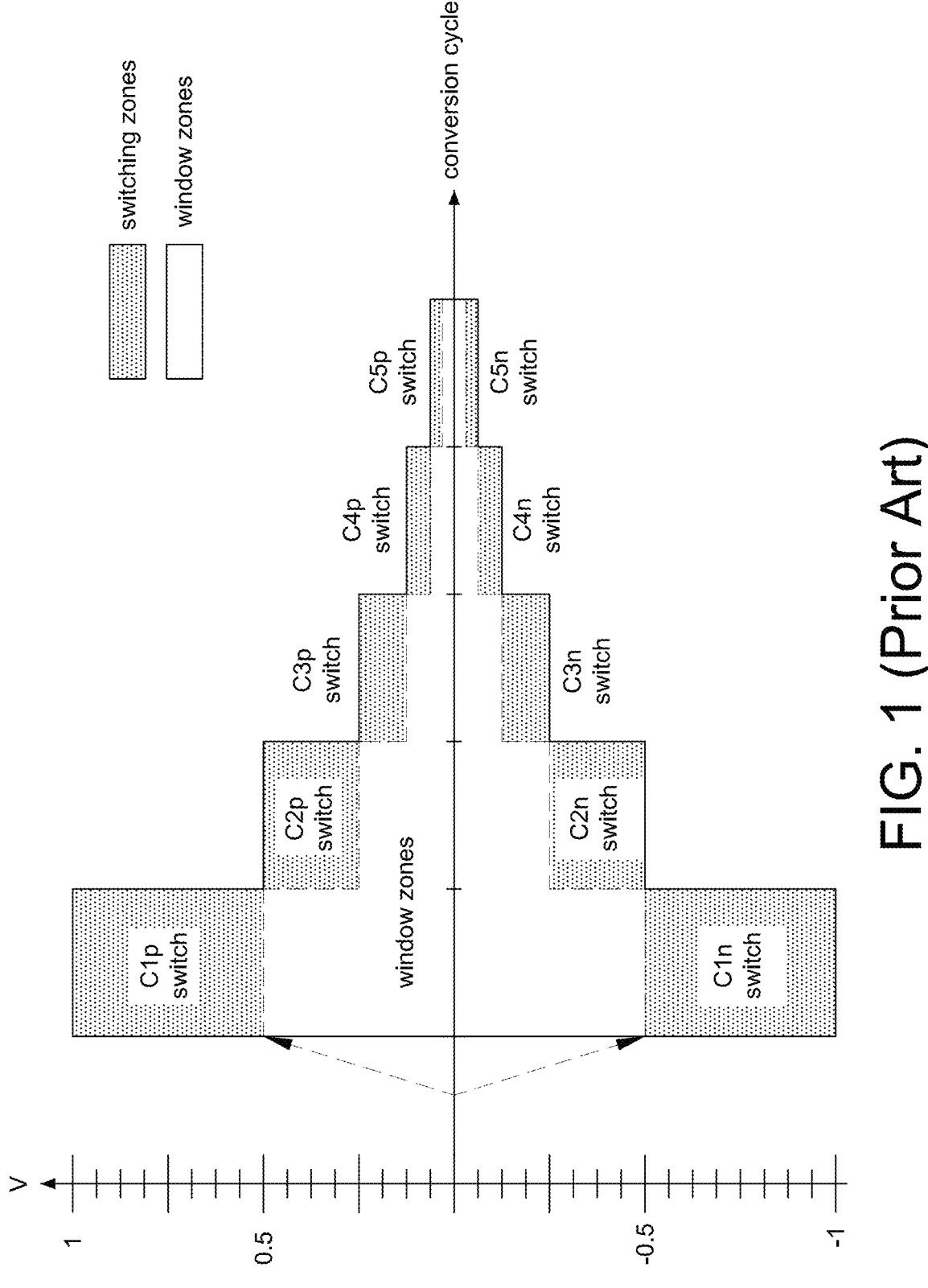
FIG. 1 is a schematic diagram of the capacitor switching of a conventional ADC having a fast binary window function.
Figure 2:
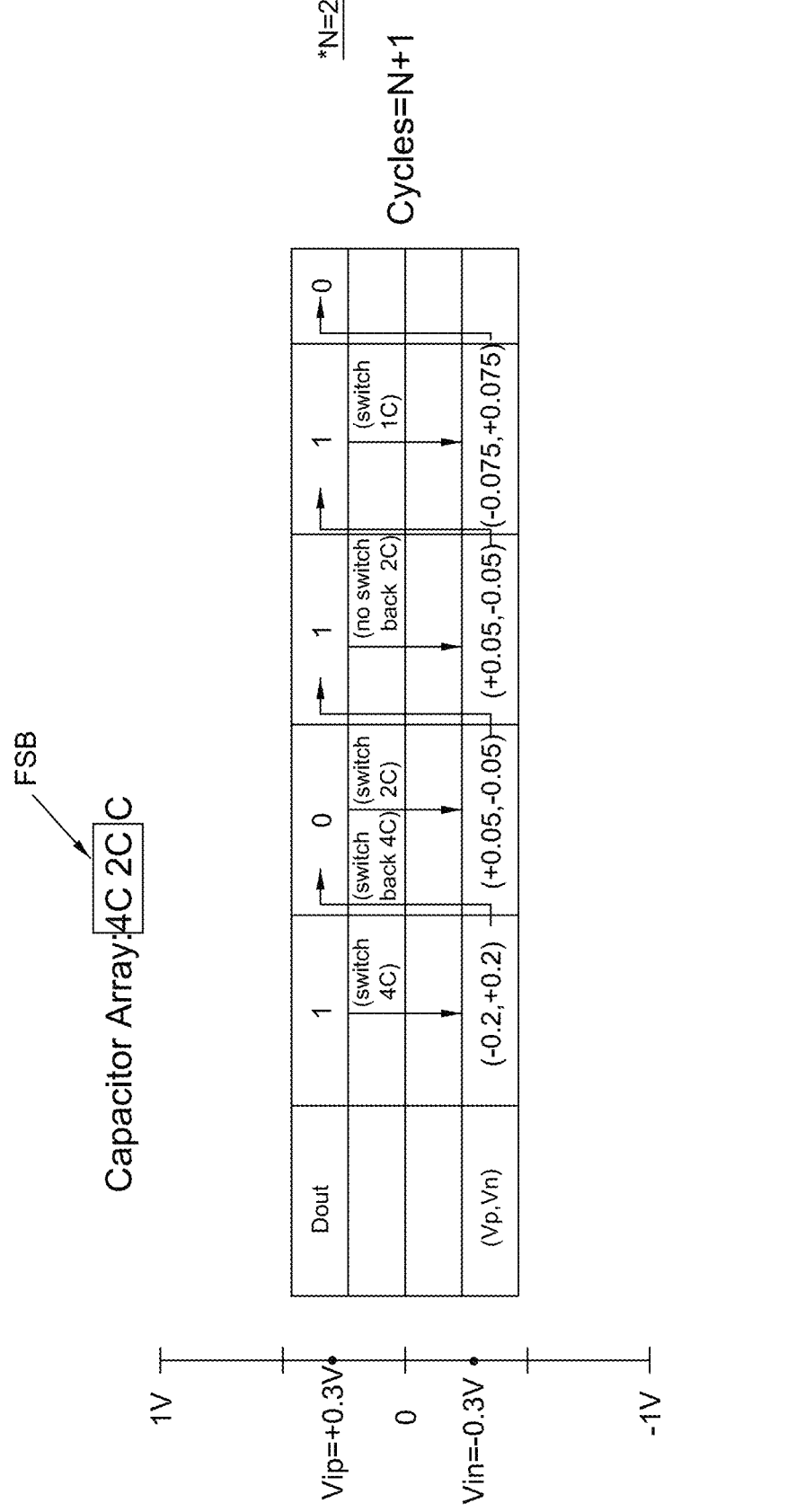
FIG. 2 is an operational schematic diagram of the capacitor switching of a conventional ADC having a fast binary window function.
Figure 3A:
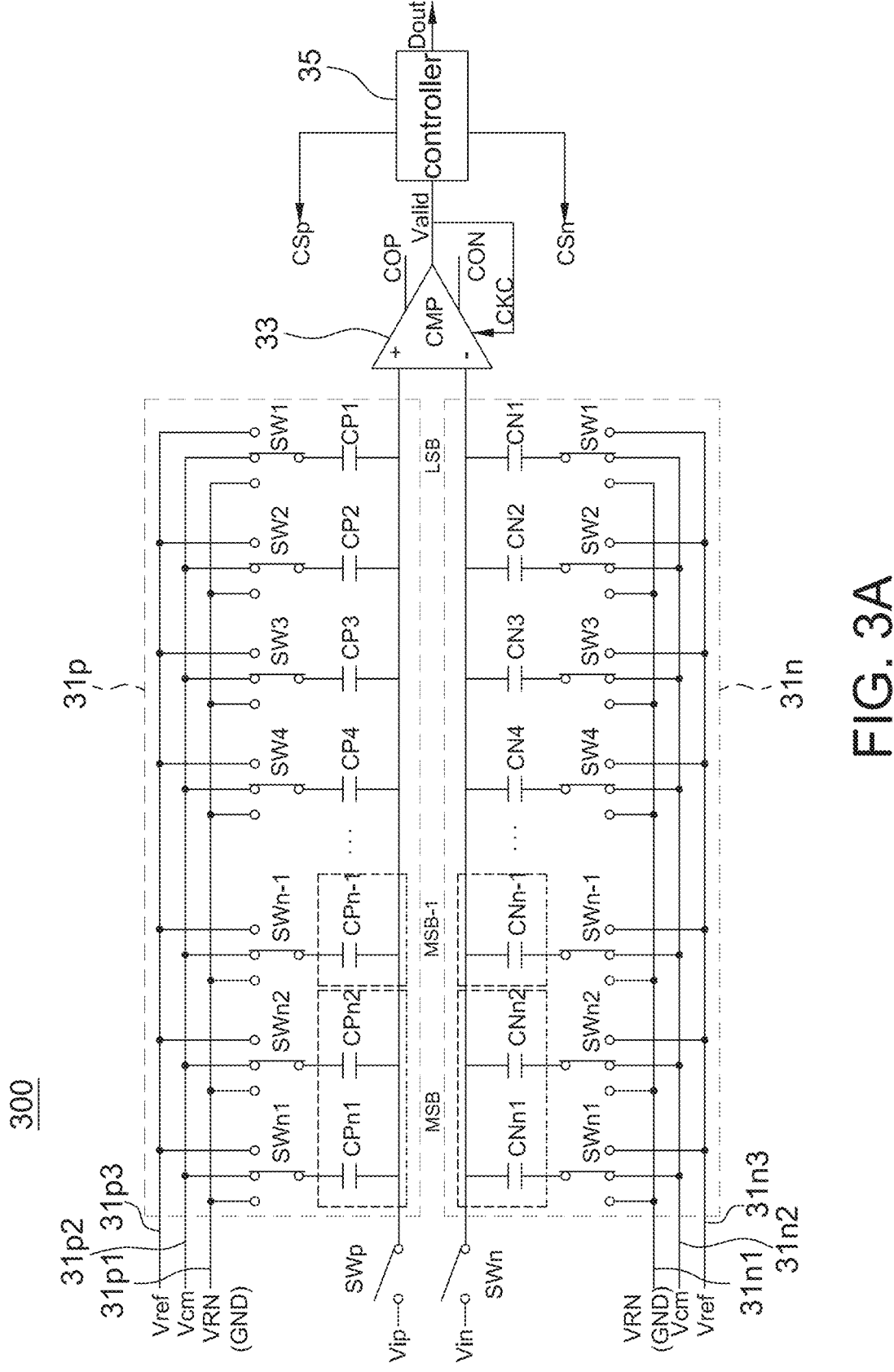
FIG. 3A is a schematic diagram of an ADC according to one embodiment of the present disclosure.

Please refer to FIG. 3A, it is a schematic diagram of an ADC 300 according to one embodiment of the present disclosure. The ADC 300 includes a first capacitor array 31$p$, a second capacitor array 31$n$, a comparator 33, a controller 35, multiple first switches and multiple second switches SW1 to SWn-1, SWn1 and SWn2, a first ground line 31$p$1, a second ground line 31$n$1, a first common line 31$p$2, a second common line 31$n$2, a first reference line 31$p$3, a second reference line 31$n$3, a first sampling switch SWp and a second sampling switch SWn.

The multiple first switches SW1 to SWn-1, SWn1 and SWn2 coupled to the first capacitor array 31$p$ are respectively coupled to a first end (e.g., shown as upper end) of each capacitor of the first capacitor array 31$p$. The multiple second switches SW1 to SWn-1, SWn1 and SWn2 coupled to the second capacitor array 31$n$ are respectively coupled to a first end (e.g., shown as lower end) of each capacitor of the second capacitor array 31$n$.

In one aspect, the multiple first switches SW1 to SWn-1, SWn1 and SWn2 coupled to the first capacitor array 31$p$ and the multiple second switches SW1 to SWn-1, SWn1 and SWn2 coupled to the second capacitor array 31$n$ are operated correspondingly.

The controller 35 is used to output a first control signal CSp to control the multiple first switches SW1 to SWn-1, SWn1 and SWn2 to be coupled to the first ground line 31$p$1, the first common line 31$p$2 or the first reference line 31$p$3, respectively. The controller 35 is further used to output a second control signal CSn to control the multiple second switches SW1 to SWn-1, SWn1 and SWn2 to be coupled to the second ground line 31$n$1, the second common line 31$n$2 or the second reference line 31$n$3, respectively. The controller 35 includes, for example, an application specific integrated circuit (ASIC) or a field programmable gate array (FPGA) to determine the switching of the multiple first switches and the multiple second switches controlled by the first control signal CPn and the second control signal CSn according a comparison result of the comparator 33.

The first ground line 31$p$1 (e.g., coupled to a ground voltage VRN), the first common line 31$p$2 (e.g., coupled to a common voltage Vcm) and the first reference line 31$p$3 (e.g., coupled to a reference voltage Vref) are respectively coupled to the first end of each capacitor of the first capacitor array 31$p$ via the multiple first switches SW1 to SWn-1, SWn1 and SWn2. The second ground line 31$n$1 (e.g., coupled to ground voltage VRN), the second common line 31$n$2 (e.g., coupled to a common voltage Vcm) and the second reference line 31$n$3 (e.g., coupled to a reference voltage Vref) are respectively coupled to the first end of each capacitor of the second capacitor array 31$n$ via the multiple second switches SW1 to SWn-1, SWn1 and SWn2.

The first sampling switch SWp is coupled to a second end (e.g., shown as lower end) of each capacitor of the first capacitor array 31$p$ and to a first input terminal (e.g., non-inverting input terminal) of the comparator 33. The second sampling switch SWn is coupled to a second end (e.g., shown as upper end) of each capacitor of the second capacitor array 31$n$ and to a second input terminal (e.g., inverting input terminal) of the comparator 33.

The first capacitor array 31$p$ is coupled to the first input terminal of the comparator 33, and includes multiple capacitors CP1, CP2, CP3, CP4 to CPn-1, CPn1 and CPn2 connected in parallel. A first most significant bit (MSB) of the first capacitor array 31$p$ includes multiple capacitors (e.g., FIG. 3A showing two capacitors CPn1 and CPn2), a first (MSB-1) of the first capacitor array 31$p$ includes at least one capacitor (e.g., FIG. 3A showing one capacitor CPn-1). Capacitance of each capacitor of the first MSB is equal to capacitance of each capacitor of the at least one capacitor (i.e. CPn-1) of the first (MSB-1).

The second capacitor array 31$n$ is coupled to the second input terminal of the comparator 33, and includes multiple capacitors CN1, CN2, CN3, CN4 to CNn-1, CNn1 and CNn2 connected in parallel. A second most significant bit (MSB) of the second capacitor array 31$n$ includes multiple capacitors (e.g., FIG. 3A showing two capacitors CNn1 and CNn2), and a second (MSB-1) of the second capacitor array 31$n$ includes at least one capacitor (e.g., FIG. 3A showing one capacitor CNn-1). Capacitance of each capacitor of the second MSB is equal to capacitance of each capacitor of the at least one capacitor (i.e. CNn-1) of the second (MSB-1).

Numbers of capacitors and corresponding switches included in the ADC 300 are determined according to a stage of the capacitor arrays and thermal codes. Please refer to FIG. 3B, it is a schematic diagram of the arrangement of 10-stage multiple capacitors having different bits of thermal codes, implemented by MSB capacitors. It should be mentioned that the present disclosure is not limited to using 4-bit thermal coding, and more than 4-bit thermal coding may be used. Because larger errors caused by the capacitor mismatch generally occur at the MSB, the thermal codes are arranged from the MSB of the first capacitor array 31$p$ and the second capacitor array 31$n$. The capacitors of the first capacitor array 31$p$ and the second capacitor array 31$n$ are arranged in the same way.

It is seen from FIG. 3B that in an aspect of using 2-bit thermal coding, the MSB of the first capacitor array 31$p$ and the second capacitor array 31$n$ respectively includes two capacitors (e.g., shown as 128C), and the two capacitors are connected in parallel (e.g., referring to CPn1 and CPn2 in FIG. 3A) and have identical capacitance. The (MSB-1) of the first capacitor array 31$p$ and the second capacitor array 31$n$ respectively includes one capacitor (e.g., shown as 128C). The capacitance (e.g., shown as 64C) of the (MSB-2) of the first capacitor array 31$p$ and the second capacitor array 31$n$ is ½ of the capacitance (e.g., shown as 128C) of the (MSB-1).

It is seen from FIG. 3B that in an aspect of using 3-bit thermal coding, the MSB of the first capacitor array 31$p$ and the second capacitor array 31$n$ respectively includes four capacitors (e.g., shown as 64C), and the four capacitors are connected in parallel and have identical capacitance. The (MSB-1) of the first capacitor array 31*p* and the second capacitor array 31*n* respectively includes two capacitors (e.g., shown as 64C), and the two capacitors are connected in parallel and have identical capacitance. The capacitance (e.g., shown as 64C) of the (MSB-2) of the first capacitor array 31*p* and the second capacitor array 31*n* is identical to the capacitance of each capacitor (e.g., shown as 64C) of the two capacitors of the (MSB-1).

Referring to FIG. 3B, one of ordinary skill in the art would understand the arrangement of capacitors using more bits of thermal coding, and thus details thereof are not described herein.

Figure 4A:
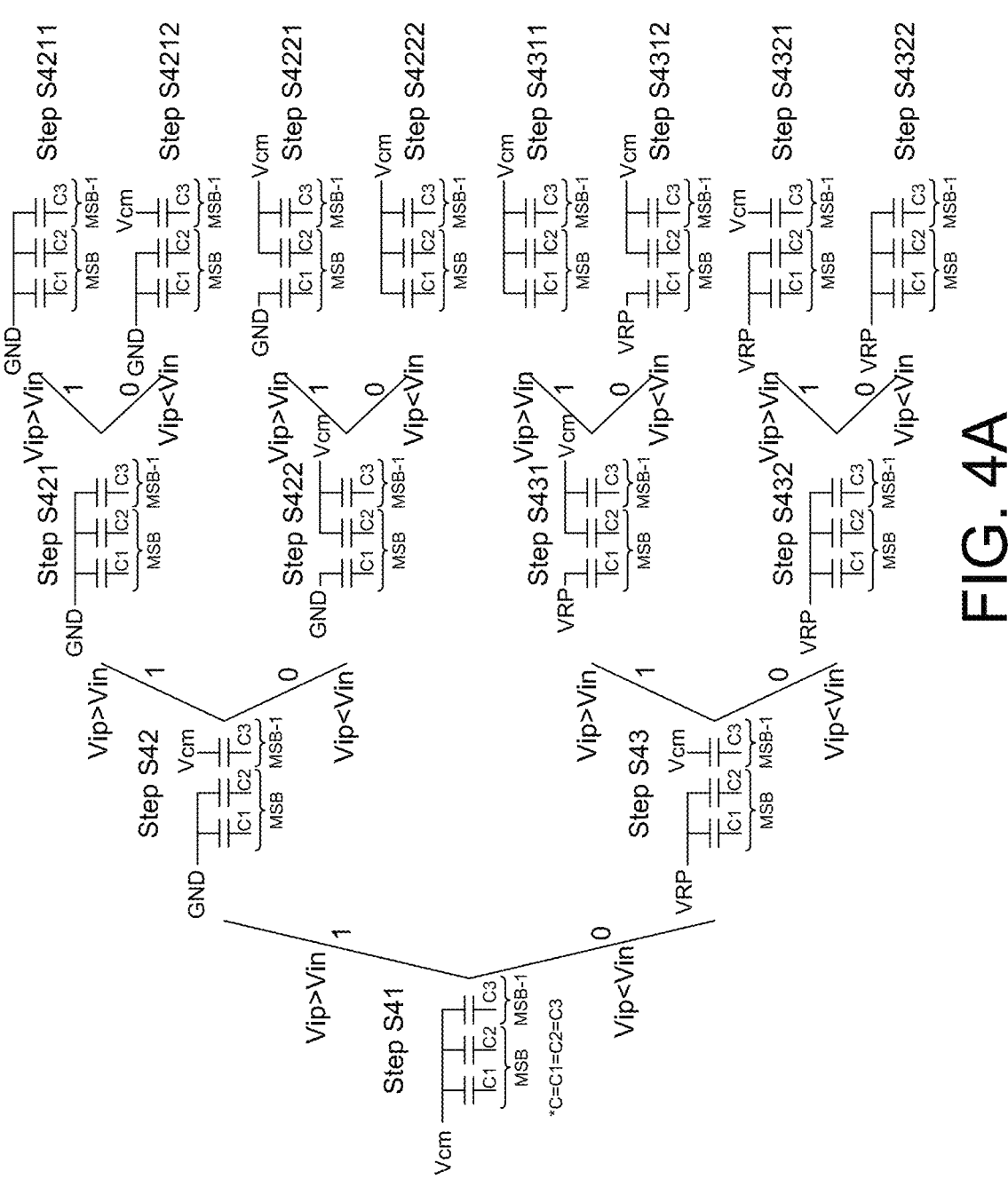
FIGS. 4A-4B are operational schematic diagrams of an ADC including 2-bit thermal codes according to one embodiment of the present disclosure.
Figure 4B:
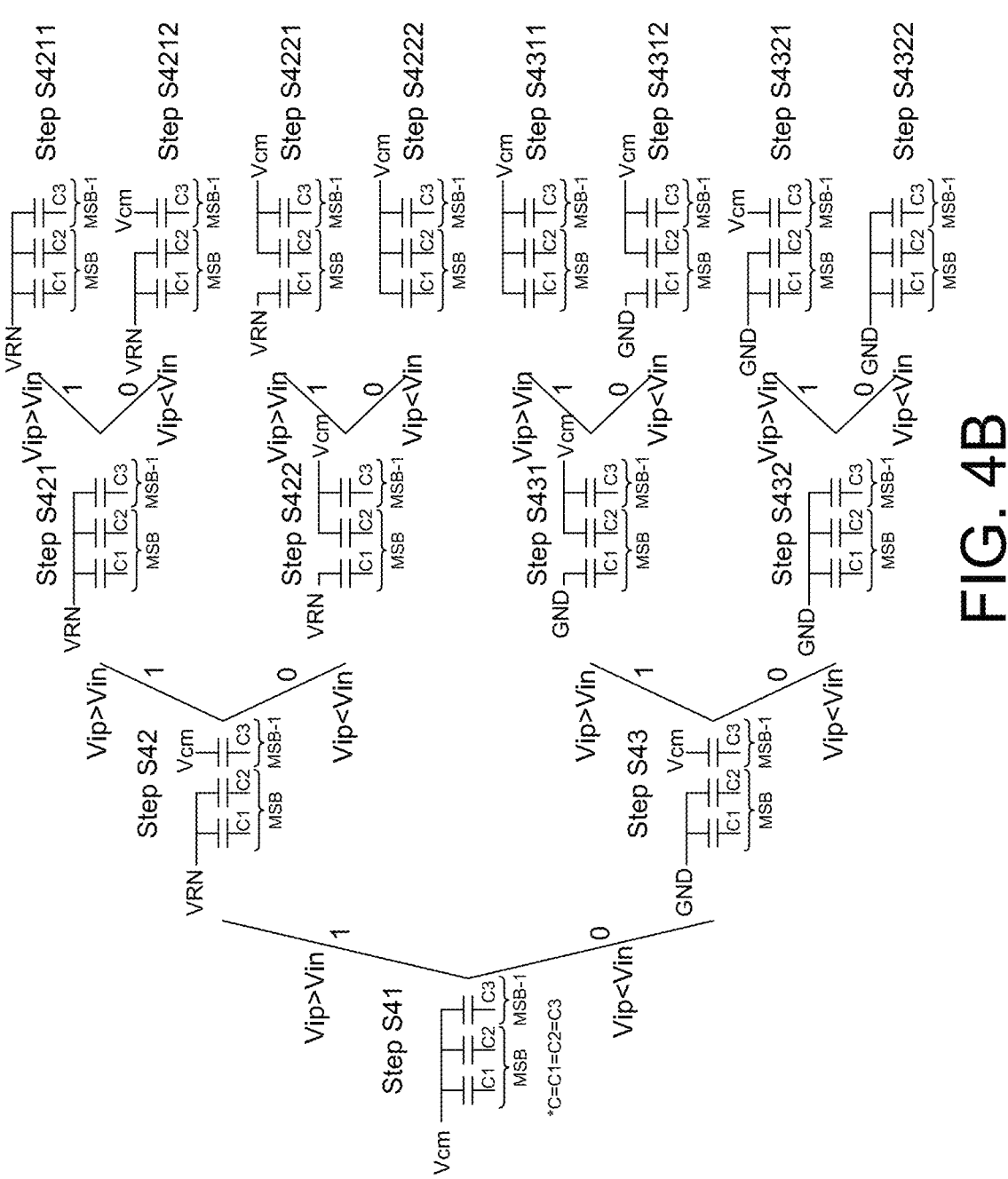

Referring to FIGS. 4A and 4B, they are operational schematic diagrams of an ADC 300 including 2-bit thermal coding according to one embodiment of the present disclosure. Since the operation of the capacitors lower than the (MSB-2) is identical to that using the fast binary window operation, FIGS. 4A-4B show only the operations of the capacitors in the MSB and (MSB-1), wherein capacitance of C1, C2 and C3 may be referred to FIG. 3B as examples.

The operating method of the ADC 300 incorporating 2-bit thermal coding is described hereinafter.

Step S41: The two capacitors C1 and C2 (e.g., shown as CPn1 and CPn2 in FIG. 3A) of the MSB and the one capacitor C3 (e.g., shown as CPn-1 in FIG. 3A) of the (MSB-1) of the first capacitor array 31*p* are coupled to a common voltage Vcm.

Step S42-S43: When a first analog input Vip inputted into the non-inverting input terminal of the comparator 33 is larger than a second analog input Vin inputted into the inverting input terminal of the comparator 33 (e.g., Dout of the comparator 33 equal to digital value "1"), the two capacitors C1 and C2 of the first capacitor array 31*p* are grounded (Step S42 in FIG. 4A). When the first analog input Vip is smaller than the second analog input Vin (e.g., Dout of the comparator 33 equal to digital value "0"), the two capacitors C1 and C2 of the first capacitor array 31*p* are coupled to the reference voltage VRP (Step S43 in FIG. 4A). In one aspect, the reference voltage VRP is 2 times of the common voltage Vcm.

In addition, when the two capacitors C1 and C2 of the MSB of the first capacitor array 31*p* are grounded, the two capacitors C1 and C2 (e.g., shown as CNn1 and CNn2 in FIG. 3A) of the MSB of the second capacitor array 31*n* are coupled to the reference voltage VRN (e.g., shown in Step S42 of FIG. 4B, wherein VRP=Vref=2×Vcm and VRN=GND=0). When the two capacitors C1 and C2 of the MSB of the first capacitor array 31*p* are coupled to the reference voltage VRP, the two capacitors C1 and C2 of the MSB of the second capacitor array 31*n* are grounded (e.g., shown in Step S43 of FIG. 4B). That is, although the first capacitor array 31*p* and the second capacitor array 31*n* are operated correspondingly, they have the difference that when the MSB of the first capacitor 31*p* is grounded, the MSB of the second capacitor array 31*n* is coupled to the reference voltage VRN; and when the MSB of the first capacitor 31*p* is coupled to the reference voltage VRP, the MSB of the second capacitor array 31*n* is grounded as shown in FIGS. 4A-4B. That is, the VRN and GND in FIG. 4B are voltages coupled to the second capacitor array 31*n*, and GND and VRP in FIG. 4A are voltages coupled to the first capacitor array 31*p*.

Step S421-S422: After the two capacitors C1 and C2 of the MSB of the first capacitor array 31*p* are grounded (i.e. after S42), the one capacitor C3 of the (MSB-1) of the first capacitor array 31*p* is grounded when the first analog input Vip is larger than the second analog input Vin (Step S421); and one of the two capacitors C1 and C2 of the MSB of the first capacitor array 31*p* is switched back to the common voltage Vcm when the first analog input Vip is smaller than the second analog input Vin (Step S422).

Step S4211-S4212: After the one capacitor C3 of the (MSB-1) of the first capacitor array 31*p* is grounded (i.e. after S421), maintaining the two capacitors C1 and C2 of the MSB and the one capacitor C3 of the (MSB-1) of the first capacitor array 31*p* to be grounded when the first analog input Vip is larger than the second analog input Vin (Step S4211); and switching back the one capacitor C3 of the (MSB-1) of the first capacitor array 31*p* to the common voltage Vcm when the first analog input Vip is smaller than the second analog input Vin (Step S4212).

Step S4221-S4222: After one of the two capacitors C1 and C2 of the MSB of the first capacitor array 31*p* is switched back to the common voltage Vcm (i.e. after S422), maintaining one of the two capacitors C1 and C2 of the MSB of the first capacitor array 31*p* to be grounded, and the other one of the two capacitors C1 and C2 of the MSB and the one capacitor C3 of the (MSB-1) of the first capacitor array 31*p* to be coupled to the common voltage Vcm when the first analog input Vip is larger than the second analog input Vin (Step S4221); and switching back both of the two capacitors C1 and C2 of the MSB of the first capacitor array 31*p* to the common voltage Vcm when the first analog input Vip is smaller than the second analog input Vin (Step S4222).

In addition, the capacitor switching of the Steps S431, S432, S4311, S4312, S4321 and 4322 are shown in FIGS. 4A and 4B, and thus details thereof are not described herein.

Figure 5A:
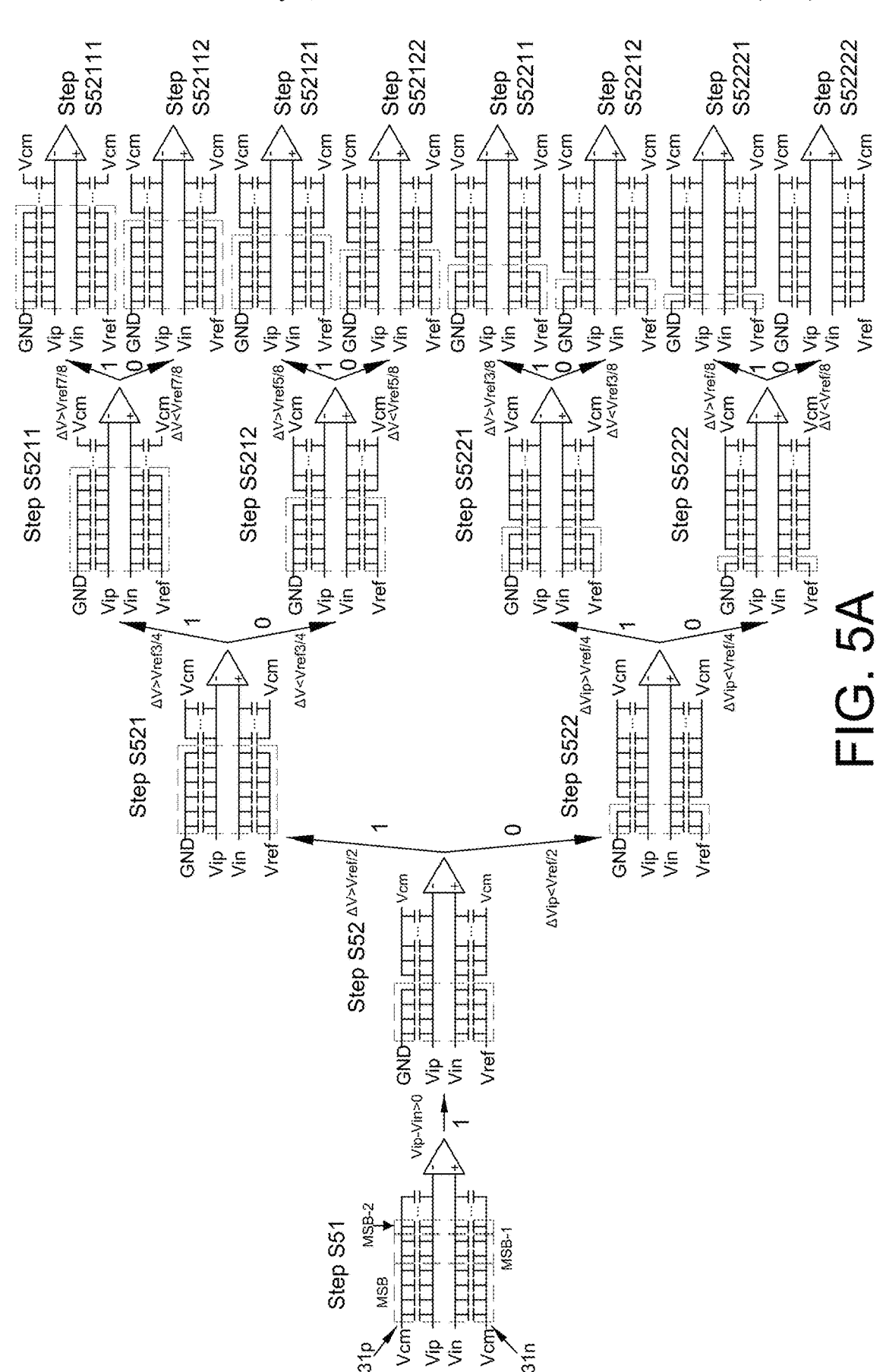
FIGS. 5A and 5B are operational schematic diagrams of an ADC including 3-bit thermal codes according to one embodiment of the present disclosure.
Figure 5B:
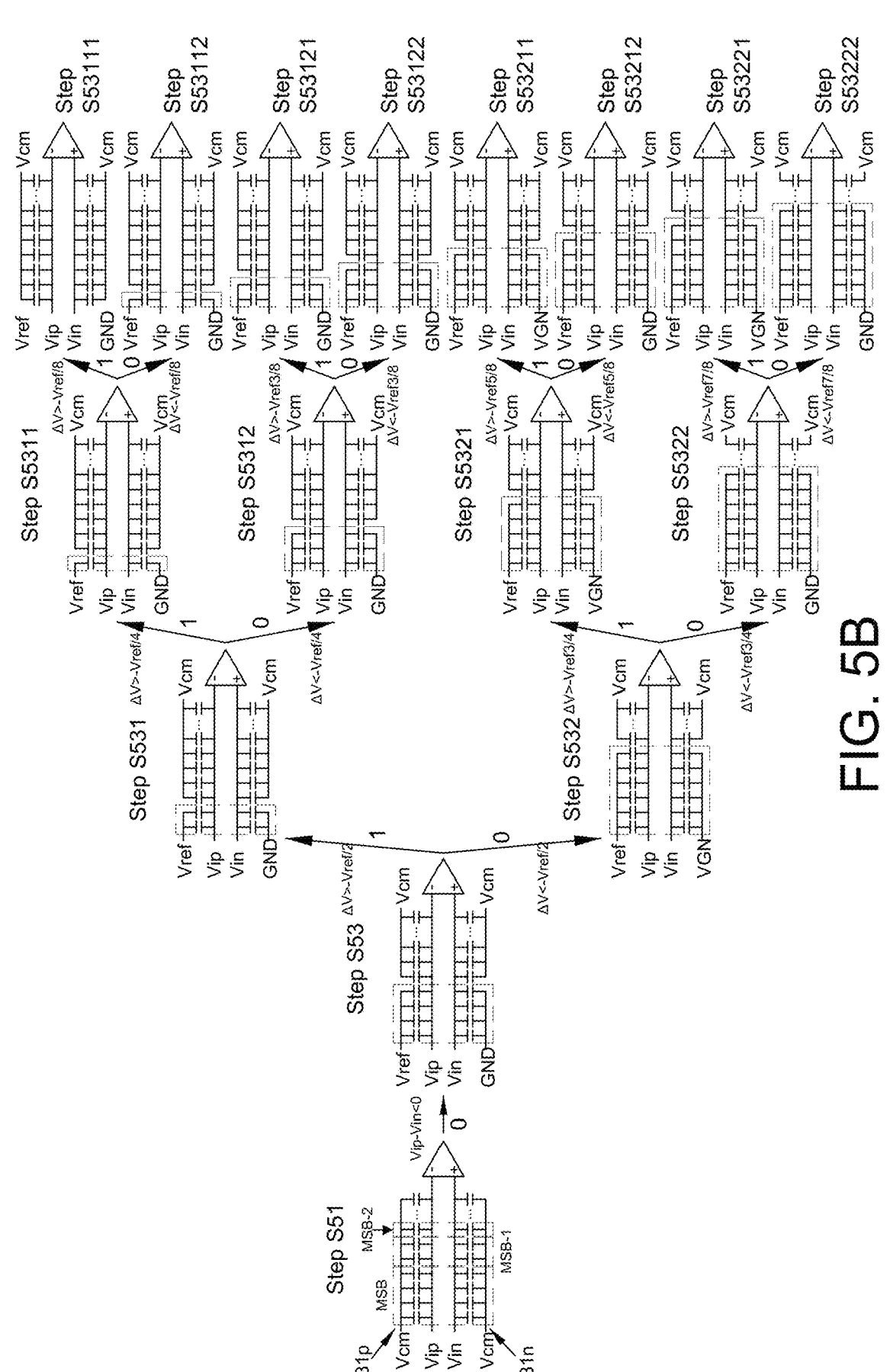

Referring to FIGS. 5A and 5B, it is an operational schematic diagram of an ADC 300 including 3-bit thermal coding according to one embodiment of the present disclosure. Since the operation of the capacitors lower than the (MSB-3) is identical to that using the fast binary window operation, FIGS. 5A and 5B show only the operations of the capacitors in the MSB, (MSB-1) and (MSB-2), wherein capacitance of the capacitors may be referred to FIG. 3B. It should be mentioned that FIGS. 5A and 5B respectively show different processes started from the same Step S51.

The operating method of the ADC 300 incorporating 3-bit thermal coding is described hereinafter.

Step S51: The four capacitors of the MSB, the two capacitors of the (MSB-1) and the one capacitor of the (MSB-2) of the first capacitor array 31*p* are coupled to a common voltage Vcm.

Step S52-S53: When a first analog input Vip inputted into the non-inverting input terminal of the comparator 33 is larger than a second analog input Vin inputted into the inverting input terminal of the comparator 33 (e.g., Dout of the comparator 33 equal to digital value "1"), the four capacitors of the first capacitor array 31*p* are grounded (Step S52), referring to FIG. 5A. When the first analog input Vip is smaller than the second analog input Vin (e.g., Dout of the comparator 33 equal to digital value "0"), the four capacitors of the first capacitor array 31*p* are coupled to the reference voltage Vref (Step S53), referring to FIG. 5B. In one aspect, the reference voltage Vref is 2 times of the common voltage Vcm.

In addition, when the four capacitors of the MSB of the first capacitor array 31*p* are grounded, the four capacitors of the MSB of the second capacitor array 31*n* are coupled to the reference voltage Vref, referring to FIG. 5A. When the four capacitors of the MSB of the first capacitor array 31*p* are coupled to the reference voltage Vref, the four capacitors of the MSB of the second capacitor array $31n$ are grounded, referring to FIG. 5B.

Step S521-S522: After the four capacitors of the MSB of the first capacitor array $31p$ are grounded (i.e. after S52), the two capacitors of the (MSB-1) of the first capacitor array $31p$ are grounded when a difference between the first analog input Vip and the second analog input Vin is larger than ½ of the reference voltage Vref (e.g., Dout of the comparator 33 equal to digital value "1") (Step S521); and two of the four capacitors of the MSB of the first capacitor array $31p$ are switched back to the common voltage Vcm when the difference between the first analog input Vip the second analog input Vin is smaller than ½ of the reference voltage Vref (e.g., Dout of the comparator 33 equal to digital value "0") (Step S522).

Step S5211-S5212: After the two capacitors of the (MSB-1) of the first capacitor array $31p$ are grounded (i.e. after S521), the one capacitor of the (MSB-2) of the first capacitor array $31p$ is founded when the difference between the first analog input Vip and the second analog input Vin is larger than ¾ of the reference voltage Vref (e.g., Dout of the comparator 33 equal to digital value "1") (Step S5211); and one of the two capacitors of the (MSB-1) is switched back to the common voltage Vcm when the difference between the first analog input Vip and the second analog input Vin is smaller than ¾ of the reference voltage Vref (e.g., Dout of the comparator 33 equal to digital value "0") (Step S5212).

Step S52111-S52112: After the one capacitor of the (MSB-2) of the first capacitor array $31p$ is grounded (i.e. after S5211), maintaining the four capacitors of the MSB, the two capacitors of the (MSB-1) and the one capacitor of the (MSB-2) to be grounded when the difference between the first analog input Vip and the second analog input Vin is larger than ⅞ of the reference voltage Vref (e.g., Dout of the comparator 33 equal to digital value "1"); and switching back the one capacitor of the (MSB-2) of the first capacitor array $31p$ to the common voltage Vcm when the difference between the first analog input Vip and the second analog input Vin is smaller than ⅞ of the reference voltage Vref (e.g., Dout of the comparator 33 equal to digital value "0") (Step S52112).

Step S52121-S52122: After one of the two capacitors of the (MSB-1) of the first capacitor array $31p$ is switched back to the common voltage Vcm (i.e. after S5212), maintaining the four capacitors of the MSB and one of the two capacitors of the (MSB-1) of the first capacitor array $31p$ to be grounded when the difference between the first analog input Vip and the second analog input Vin is larger than ⅝ of the reference voltage Vref (e.g., Dout of the comparator 33 equal to digital value "1") (Step S52121); and switching back both of the two capacitors of the (MSB-1) of the first capacitor array $31p$ to the common voltage Vcm when the difference between the first analog input Vip and the second analog input Vin is smaller than ⅝ of the reference voltage Vref (e.g., Dout of the comparator 33 equal to digital value "0") (Step S52122).

Step S5221-S5222: After two of the four capacitors of the MSB of the first capacitor array $31p$ are switched back to the common voltage Vcm (i.e. after S522), three of the four capacitors of the MSB of the first capacitor array $31p$ are grounded when the difference between the first analog input Vip and the second analog input Vin is larger than ¼ of the reference voltage Vref (e.g., Dout of the comparator 33 equal to digital value "1") (Step S5221); and one of the four capacitors of the MSB is grounded when the difference between the first analog input Vip and the second analog input Vin is smaller than ¼ of the reference voltage Vref (e.g., Dout of the comparator 33 equal to digital value "0") (Step S5222).

Step S52211-S52212: After three of the four capacitors of the MSB of the first capacitor array $31p$ are grounded (i.e. after S5221), maintaining the three of the four capacitors of the MSB to be grounded when the difference between the first analog input Vip and the second analog input Vin is larger than ⅜ of the reference voltage Vref (e.g., Dout of the comparator 33 equal to digital value "1") (Step S52212); and switching back one of the three capacitors of the MSB of the first capacitor array $31p$ to the common voltage Vcm when the difference between the first analog input Vip and the second analog input Vin is smaller than ⅜ of the reference voltage Vref (e.g., Dout of the comparator 33 equal to digital value "0") (Step S52212).

Step S52221-S52222: After one of the three capacitors of the MSB of the first capacitor array $31p$ is switched back to the common voltage Vcm (i.e. after S5222), maintaining one of the four capacitors of the MSB to be grounded when the difference between the first analog input Vip and the second analog input Vin is larger than ⅛ of the reference voltage Vref (e.g., Dout of the comparator 33 equal to digital value "1") (Step S52221); and connecting the four capacitors of the MSB, the two capacitors of the (MSB-1) and the one capacitor of the (MSB-2) of the first capacitor array $31p$ to the common voltage Vcm when the difference between the first analog input Vip and the second analog input Vin is smaller than ⅛ of the reference voltage Vref (e.g., Dout of the comparator 33 equal to digital value "0") (Step S52222).

In addition, the capacitor switching of the Steps S531, S532, S5311, S5312, S5321, S5322, S53111, S53112, S53121, S53122, S53211, S53212, S53221 and 53222 are shown in FIG. 5B, and thus details thereof are not described herein.

In brief, in switching the thermal codes (i.e. dividing one capacitor into multiple identical capacitors connected in parallel), the first switching is to switch all thermal coding capacitors of the MSB together. Next, in the following switching, increasing and decreasing the switched capacitors by one or multiple thermal coding capacitors to cause the final switching result to have a difference of one thermal coding capacitor from one another (e.g., FIG. 5A showing that a number of capacitors connected to GND and Vref decreases by 1 from the Step S52111 to Step S52222) such that the error caused by capacitor mismatch is reduced. In this way, no matter how many bits of thermal codes are used, the switching is similar to FIGS. 4A to 4B and FIGS. 5A to 5B. For example, in the ADC 300 including 4-bit thermal codes (e.g., referring to FIG. 3B), in the first switching, the eight capacitors of the MSB is switched together; in the second switching, the four capacitors of the (MSB-1) are further switched or four of the eight capacitors of the MSB are switched back; and in the third switching, two capacitors of the (MSB-2) are further switched, or two of the switched four capacitors of the (MSB-1) are switched back, or maintaining six of the eight capacitors of the MSB to be switched, or maintaining two of the eight capacitors of the MSB to be switched; and so on.

Figure 6:
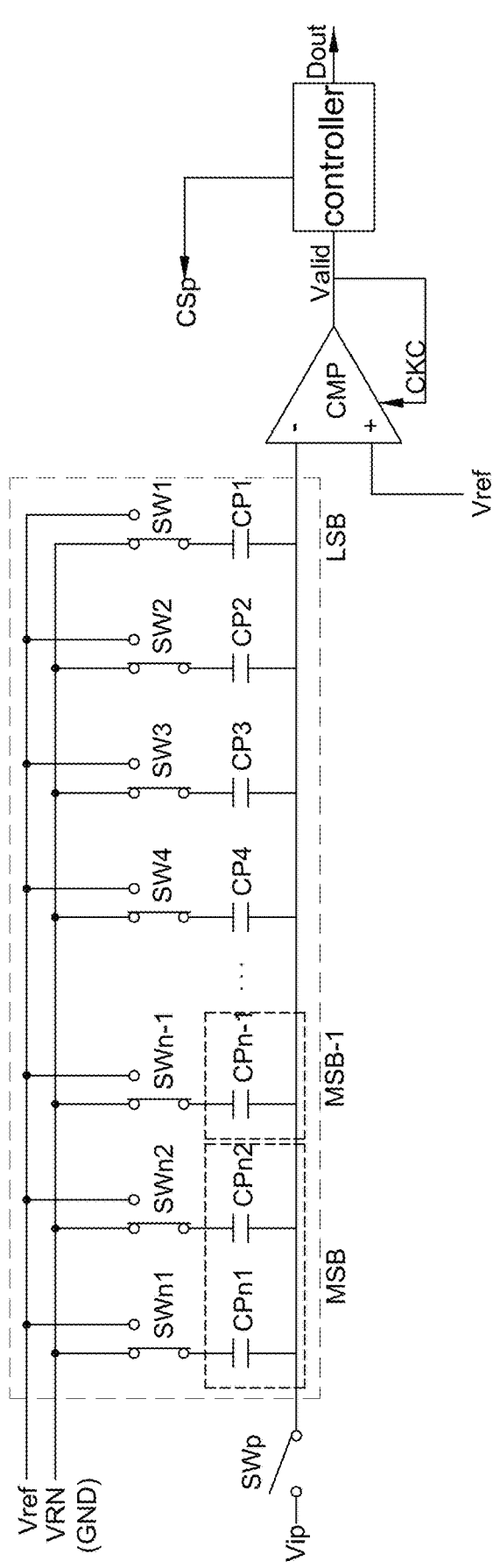
FIG. 6 is a schematic diagram of an ADC according to another embodiment of the present disclosure.

It should be mentioned that although the present disclosure is described by using a differential ADC as an example, the present disclosure is not limited thereto. The present disclosure is also adaptable to a single-ended ADC as shown in FIG. 6. The main different between FIG. 6 and FIG. 3 is that in FIG. 6, the inverting input terminal of the comparator CMP is coupled to a reference voltage Vref to be compared with an analog input Vip on the non-inverting input terminal so as to determine the capacitor switching similar to FIGS. 4A and 5A.

It should be mentioned that the values, including the voltage values, size of capacitor arrays and number of bits of thermal coding are only intended to illustrate but not to limit the present disclosure.

As mentioned above, the ADC incorporating only the fast binary window function can only improve the INL but is unable to improve the DNL. Accordingly, the present disclosure further provides an SAR ADC (e.g., FIGS. 3 and 6) and an operating method thereof (e.g., FIG. 4A to FIG. 5B) that replace a side of the MSB of the capacitor array by thermal codes to improve both the DNL and INL. In addition, the SAR ADC of the present disclosure does not increase the number of capacitor switching compared with the conventional SAR ADC.

Although the disclosure has been explained in relation to its preferred embodiment, it is not used to limit the disclosure. It is to be understood that many other possible modifications and variations can be made by those skilled in the art without departing from the spirit and scope of the disclosure as hereinafter claimed.

What is claimed is:

1. An analog-to-digital converter, comprising:
   a comparator, comprising a non-inverting input terminal and an inverting input terminal;
   a first capacitor array, coupled to the non-inverting input terminal of the comparator, and comprising a first most significant bit (MSB) and a first (MSB-1), wherein
   the first MSB includes multiple capacitors,
   the first (MSB-1) includes at least one capacitor, and
   capacitance of each of the multiple capacitors of the first MSB is identical to that of each of the at least one capacitor of the first (MSB-1); and
   multiple first switches, each respectively coupled to a first end of a corresponding capacitor of the first capacitor array, wherein
   switches among the multiple first switches and coupled to the capacitors of the first MSB and the first (MSB-1) are switched only according to whether a first analog input inputted into the non-inverting input terminal is larger than or smaller than and a second analog input inputted into the inverting input terminal, and
   switches among the multiple first switches and coupled to capacitors other than the capacitors of the first MSB and the first (MSB-1) are switched according to a fast binary window operation.

2. The analog-to-digital converter as claimed in claim 1, further comprising:
   a controller, configured to output a first control signal to control a line to be coupled to the multiple first switches.

3. The analog-to-digital converter as claimed in claim 2, further comprising:
   a first ground line;
   a first reference line; and
   a first common line, wherein the first ground line, the first reference line and the first common line are selectively coupled to the first end of each capacitor of the first capacitor array via a corresponding first switch among the multiple first switches.

4. The analog-to-digital converter as claimed in claim 3, further comprising a first sampling switch coupled to a second end of each capacitor of the first capacitor array.

5. The analog-to-digital converter as claimed in claim 2, further comprising:

a second capacitor array, coupled to the inverting input terminal of the comparator, and comprising a second MSB and a second (MSB-1), wherein
   the second MSB includes multiple capacitors,
   the second (MSB-1) includes at least one capacitor, and
   capacitance of each of the multiple capacitors of the second MSB is identical to that of each of the at least one capacitor of the second (MSB-1).

6. The analog-to-digital converter as claimed in claim 5, further comprising:
   multiple second switches, each respectively coupled to a first end of a corresponding capacitor of the second capacitor array, wherein
   the controller is further configured to output a second control signal to control a line coupled to the multiple second switches.

7. The analog-to-digital converter as claimed in claim 6, further comprising:
   a second ground line;
   a second reference line; and
   a second common line, wherein the second ground line, the second reference line and the second common line are selectively coupled to the first end of each capacitor of the second capacitor array via a corresponding second switch among the multiple second switches.

8. The analog-to-digital converter as claimed in claim 7, further comprising a second sampling switch coupled to a second end of each capacitor of the second capacitor array.

9. The analog-to-digital converter as claimed in claim 1, wherein
   the first MSB includes two capacitors, and the two capacitors are coupled in parallel and have the identical capacitance,
   the first (MSB-1) includes one capacitor, and
   capacitance of a (MSB-2) of the first capacitor array is ½ of that of the one capacitor of the first (MSB-1).

10. The analog-to-digital converter as claimed in claim 1, wherein
   the first MSB includes four capacitors, and the four capacitors are coupled in parallel and have the identical capacitance,
   the first (MSB-1) includes two capacitors, and the two capacitors are coupled in parallel and have the identical capacitance, and
   capacitance of a (MSB-2) of the first capacitor array is identical to that of each of the two capacitors of the first (MSB-1).

11. An operating method of an analog-to-digital converter, the analog-to-digital converter comprising a comparator, a first capacitor array and a second capacitor array respectively coupled to a non-inverting input terminal and an inverting input terminal of the comparator, a most significant bit (MSB) of each of the first capacitor array and the second capacitor array including two capacitors, and a (MSB-1) of each of the first capacitor array and the second capacitor array including one capacitor, the operating method comprising:
   coupling the two capacitors of the MSB and the one capacitor of the (MSB-1) of each of the first and second capacitor arrays to a common voltage;
   grounding the two capacitors of the MSB of the first capacitor array upon a first analog input inputted into the non-inverting input terminal being larger than a second analog input inputted into the inverting input terminal;

coupling the two capacitors of the MSB of the first capacitor array to a reference voltage upon the first analog input being smaller than the second analog input, wherein the reference voltage is 2 times of the common voltage; and controlling switches, coupled to capacitors among the first capacitor array and the second capacitor array but not coupled to the MSB and the (MSB-1) of the first and second capacitor arrays, according to a fast binary window operation.

12. The operating method as claimed in claim 11, further comprising:

coupling the two capacitors of the MSB of the second capacitor array to the reference voltage upon the two capacitors of the MSB of the first capacitor array being grounded; and grounding the two capacitors of the MSB of the second capacitor array upon the two capacitors of the MSB of the first capacitor array being coupled to the reference voltage.

13. The operating method as claimed in claim 11, wherein after the two capacitors of the MSB of the first capacitor array are grounded, the operating method further comprises:

grounding the one capacitor of the (MSB-1) of the first capacitor array upon the first analog input being larger than the second analog input; and switching back one of the two capacitors of the MSB of the first capacitor array to the common voltage upon the first analog input being smaller than the second analog input.

14. The operating method as claimed in claim 13, wherein after the one capacitor of the (MSB-1) of the first capacitor array is grounded, the operating method further comprises:

maintaining the two capacitors of the MSB and the one capacitor of the (MSB-1) of the first capacitor array to be grounded upon the first analog input being larger than the second analog input; and switching back the one capacitor of the (MSB-1) of the first capacitor array to the common voltage upon the first analog input being smaller than the second analog input.

15. The operating method as claimed in claim 13, wherein after the one of the two capacitors of the MSB of the first capacitor array is switched back to the common voltage, the operating method further comprises:

maintaining the other one of the two capacitors of the MSB of the first capacitor array to be grounded, and the one of the two capacitors of the MSB and the one capacitor of the (MSB-1) of the first capacitor array to be coupled to the common voltage upon the first analog input being larger than the second analog input; and switching back both of the two capacitors of the MSB of the first capacitor array to the common voltage upon the first analog input being smaller than the second analog input.

16. An operating method of an analog-to-digital converter, the analog-to-digital converter comprising a comparator, a first capacitor array and a second capacitor array respectively coupled to a non-inverting input terminal and an inverting input terminal of the comparator, a most significant bit (MSB) of each of the first capacitor array and the second capacitor array including four capacitors, a (MSB-1) of each of the first capacitor array and the second capacitor array including two capacitors, and a (MSB-2) of each of the first capacitor array and the second capacitor array including one capacitor, the operating method comprising:

coupling the four capacitors of the MSB, the two capacitors of the (MSB-1) and the one capacitor of the (MSB-2) of each of the first and second capacitor arrays to a common voltage;

grounding the four capacitors of the MSB of the first capacitor array upon a first analog input inputted into the non-inverting input terminal being larger than a second analog input inputted into the inverting input terminal;

coupling the four capacitors of the MSB of the first capacitor array to a reference voltage upon the first analog input being smaller than the second analog input, wherein the reference voltage is 2 times of the common voltage; and controlling switches, coupled to capacitors among the first capacitor array and the second capacitor array but not coupled to the MSB, the (MSB-1) and the (MSB-2) of the first and second capacitor arrays, according to a fast binary window operation.

17. The operating method as claimed in claim 16, further comprising:

coupling the four capacitors of the MSB of the second capacitor array to the reference voltage upon the four capacitors of the MSB of the first capacitor array being grounded; and grounding the four capacitors of the MSB of the second capacitor array upon the four capacitors of the MSB of the first capacitor array being coupled to the reference voltage.

18. The operating method as claimed in claim 16, wherein after the four capacitors of the MSB of the first capacitor array are grounded, the operating method further comprises:

grounding the two capacitors of the (MSB-1) of the first capacitor array upon a difference between the first analog input and the second analog input being larger than ½ of the reference voltage; and switching back two of the four capacitors of the MSB of the first capacitor array to the common voltage upon the difference between the first analog input and the second analog input being smaller than ½ of the reference voltage.

19. The operating method as claimed in claim 18, wherein after the two capacitors of the (MSB-1) of the first capacitor array are grounded, the operating method further comprises:

grounding the one capacitor of the (MSB-2) of the first capacitor array upon the difference between the first analog input and the second analog input being larger than ¾ of the reference voltage; and switching back one of the two capacitors of the (MSB-1) of the first capacitor array to the common voltage upon the difference between the first analog input and the second analog input being smaller than ¾ of the reference voltage.

20. The operating method as claimed in claim 19, wherein after the one capacitor of the (MSB-2) of the first capacitor array is grounded, the operating method further comprises:

maintaining the four capacitors of the MSB, the two capacitors of the (MSB-1) and the one capacitor of the (MSB-2) of the first capacitor array to be grounded upon the difference between the first analog input and the second analog input being larger than ⅞ of the reference voltage; and switching back the one capacitor of the (MSB-2) of the first capacitor array to the common voltage upon the difference between the first analog input and the second analog input being smaller than $\frac{7}{8}$ of the reference voltage.

* * * * *